United States Patent
Lei et al.

(10) Patent No.: US 9,224,650 B2
(45) Date of Patent: Dec. 29, 2015

(54) WAFER DICING FROM WAFER BACKSIDE AND FRONT SIDE

(71) Applicants: Wei-Sheng Lei, San Jose, CA (US); Brad Eaton, Menlo Park, CA (US); Ajay Kumar, Cupertino, CA (US)

(72) Inventors: Wei-Sheng Lei, San Jose, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/103,534

(22) Filed: Dec. 11, 2013

(65) Prior Publication Data

US 2015/0079761 A1    Mar. 19, 2015

Related U.S. Application Data

(60) Provisional application No. 61/879,787, filed on Sep. 19, 2013.

(51) Int. Cl.
| H01L 21/00 | (2006.01) |
| H01L 21/46 | (2006.01) |
| H01L 21/30 | (2006.01) |
| H01L 21/78 | (2006.01) |

(Continued)

(52) U.S. Cl.
CPC ............ *H01L 21/78* (2013.01); *B23K 26/3213* (2013.01); *B23K 26/367* (2013.01); *B23K 26/409* (2013.01); *B23K 26/4065* (2013.01); *H01L 21/3081* (2013.01); *H01L 21/31127* (2013.01); *H01L 21/3213* (2013.01)

(58) Field of Classification Search
None
See application file for complete search history.

(56) References Cited

U.S. PATENT DOCUMENTS

| 4,049,944 A | 9/1977 | Garvin et al. |
| 4,339,528 A | 7/1982 | Goldman |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 Pages.

(Continued)

*Primary Examiner* — Evan Pert
*Assistant Examiner* — Shaka White
(74) *Attorney, Agent, or Firm* — Blakely Sokoloff Taylor Zafman LLP

(57) ABSTRACT

Approaches for backside laser scribe plus front side laser scribe and plasma etch dicing of a wafer or substrate are described. For example, a method of dicing a semiconductor wafer having a plurality of integrated circuits on a front side thereof and metallization on a backside thereof involves patterning the metallization on the backside with a first laser scribing process to provide a first plurality of laser scribe lines on the backside. The method also involves forming a mask on the front side. The method also involves patterning, from the front side, the mask with a second laser scribing process to provide a patterned mask with a second plurality of scribe lines exposing regions of the semiconductor wafer between the integrated circuits, wherein the second plurality of scribe lines is aligned with the first plurality of scribe lines. The method also involves plasma etching the semiconductor wafer through the second plurality of scribe lines to singulate the integrated circuits.

16 Claims, 8 Drawing Sheets

(51) Int. Cl.
*H01L 21/308* (2006.01)
*B23K 26/32* (2014.01)
*B23K 26/36* (2014.01)
*B23K 26/40* (2014.01)
*H01L 21/311* (2006.01)
*H01L 21/3213* (2006.01)

(56) References Cited

U.S. PATENT DOCUMENTS

| | | | |
|---|---|---|---|
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 2003/0111447 A1* | 6/2003 | Corkum et al. | 219/121.69 |
| 2003/0162313 A1 | 8/2003 | Kim et al. | |
| 2004/0080045 A1 | 4/2004 | Kimura et al. | |
| 2004/0137700 A1* | 7/2004 | Sekiya | 438/460 |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0079024 A1 | 4/2006 | Akram | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2007/0119892 A1* | 5/2007 | Horsfield | 225/2 |
| 2007/0264753 A1* | 11/2007 | Tomita et al. | 438/113 |
| 2007/0275541 A1 | 11/2007 | Harris et al. | |
| 2008/0283848 A1* | 11/2008 | Yamazaki | 257/88 |
| 2009/0162993 A1* | 6/2009 | Yui et al. | 438/462 |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2013/0045554 A1 | 2/2013 | Yamazaki | |
| 2013/0065378 A1 | 3/2013 | Johnson et al. | |
| 2013/0221517 A1 | 8/2013 | Su et al. | |
| 2013/0230972 A1 | 9/2013 | Johnson et al. | |

FOREIGN PATENT DOCUMENTS

| | | | |
|---|---|---|---|
| JP | 2001127011 | | 5/2001 |
| JP | 2001144126 | | 5/2001 |
| JP | 2003179005 | | 6/2003 |
| JP | 2004031526 | | 1/2004 |
| JP | 2004055684 | | 2/2004 |
| JP | 2007281526 | | 10/2007 |
| JP | 2011189408 A | * | 9/2011 |
| WO | WO-03036712 | | 5/2003 |
| WO | WO-03071591 | | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

International Search Report and Written Opinion from PCT/US2014/053699 mailed Dec. 16, 2014, 10 pgs.

* cited by examiner

WAFER DICING FROM WAFER BACKSIDE AND FRONT SIDE

CROSS-REFERENCE TO RELATED APPLICATIONS

This application claims the benefit of U.S. Provisional Application No. 61/879,787, filed on Sep. 19, 2013, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits on a front side thereof and metallization on a backside thereof involves patterning the metallization on the backside with a first laser scribing process to provide a first plurality of laser scribe lines on the backside. The method also involves forming a mask on the front side. The method also involves patterning, from the front side, the mask with a second laser scribing process to provide a patterned mask with a second plurality of scribe lines exposing regions of the semiconductor wafer between the integrated circuits, wherein the second plurality of scribe lines is aligned with the first plurality of scribe lines. The method also involves plasma etching the semiconductor wafer through the second plurality of scribe lines to singulate the integrated circuits.

In another embodiment, a method of dicing a semiconductor wafer having a plurality of integrated circuits on a front side thereof and metallization on a backside thereof involves forming a mask on the front side of the semiconductor wafer. The metallization and the backside of the semiconductor wafer have a first plurality of scribe lines therein. The method also involves patterning, from the front side, the mask with a laser scribing process to provide a patterned mask with a second plurality of scribe lines exposing regions of the semiconductor wafer between the integrated circuits. The second plurality of scribe lines is aligned with the first plurality of scribe lines. The method also involves plasma etching the semiconductor wafer through the second plurality of scribe lines to singulate the integrated circuits.

In another embodiment, a method of dicing a monocrystalline silicon substrate having a plurality of integrated circuits on a front side thereof and metallization on a backside thereof involves patterning the metallization on the backside of the monocrystalline silicon substrate with a first femtosecond-based laser scribing process to provide a first plurality of laser scribe lines on the backside. The method also involves forming a water soluble mask on the front side of the monocrystalline silicon substrate. The method also involves patterning, from the front side, the water soluble mask with a second femtosecond-based laser scribing process to provide a patterned water soluble mask with a second plurality of scribe lines exposing regions of the monocrystalline silicon substrate between the integrated circuits. The second plurality of scribe lines is aligned with the first plurality of scribe lines. The method also involves plasma etching the semiconductor wafer through the second plurality of scribe lines to singulate the integrated circuits. The method also involves removing the patterned water soluble mask with an aqueous solution.

DETAILED DESCRIPTION

Figure 1:
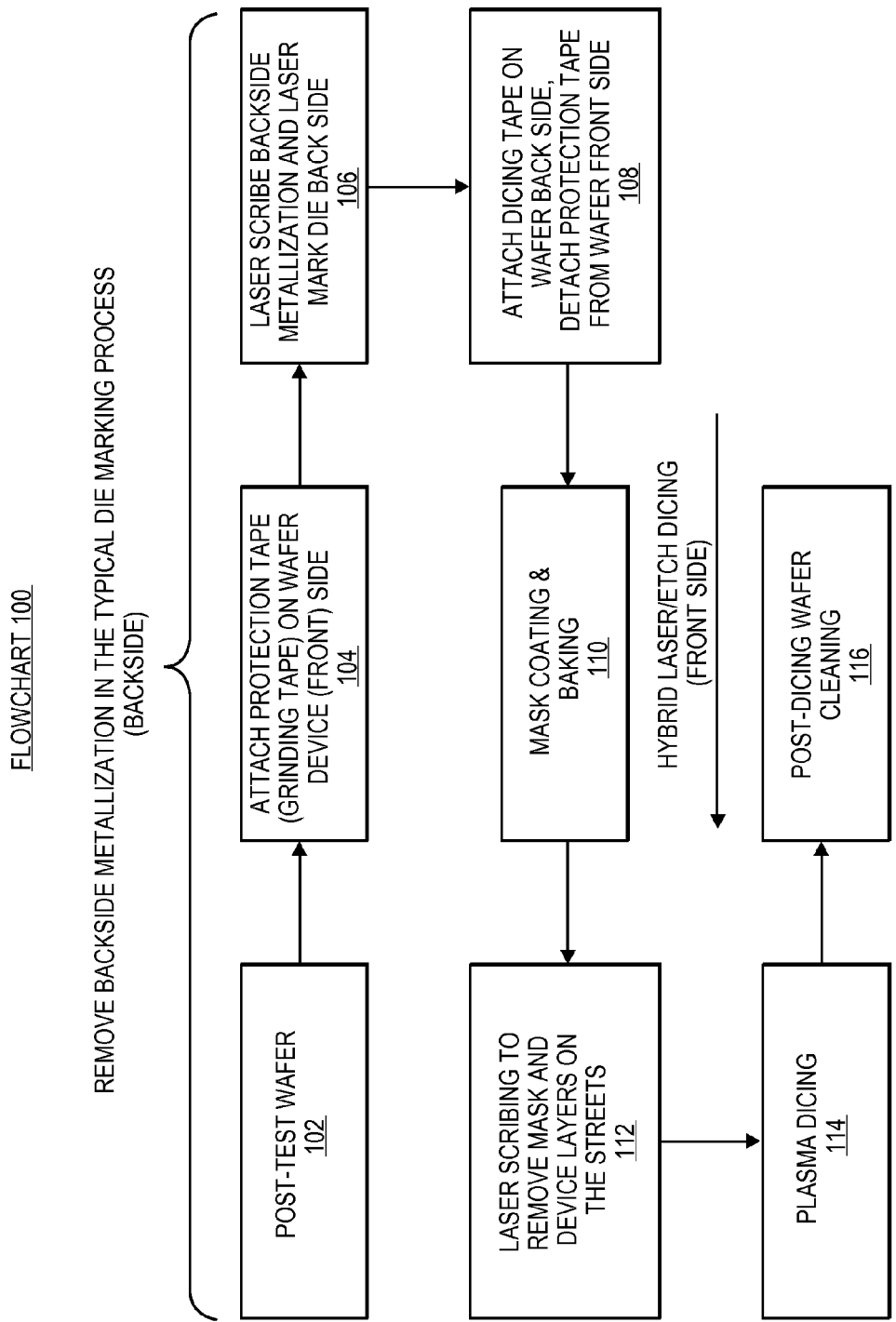
FIG. 1 is a flowchart including operations for a backside laser scribe plus front side laser scribe and plasma etch dicing process, in accordance with an embodiment of the present invention.

Methods of dicing semiconductor wafers, each wafer having a plurality of integrated circuits thereon, are described. In the following description, numerous specific details are set forth, such as femtosecond-based laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving initial laser scribing processes and subsequent plasma treatment may be implemented for die singulation. The laser scribe process may be used to cleanly remove a mask layer, organic and inorganic dielectric layers, and device layers on both sides of a wafer, as well as cut through an intervening substrate. An additional laser scribe operation may be used to remove backside metallization. The plasma etch or treatment portion of the dicing process may then be employed to yield clean die or chip singulation or dicing.

More generally, one or more embodiments are directed to wafer or substrate dicing from the wafer or substrate backside and front side in a combined approach. Particular embodiments include methods and system to dice wafers with backside metallization. For example, for high power semiconductor devices, it is common for the wafers to bear back side metallization for efficient thermal dissipation and other functional purposes. Dicing wafers with back side metallization presents difficulty for conventional blade dicing technologies and can also pose difficult for laser scribing/plasma etching approaches since etching backside metallization can be either time consuming, expensive or difficult to accomplish. A laser cut-though dicing approach can handle this well but such an approach may have limitations in keeping device side and side wall from being damaged. One or more embodiments enable laser scribing/plasma etching based dicing dicing technology for applicability to dicing wafers with backside metallization.

More specifically, some wafers or substrates bear metal and/or dielectric layers on the wafer or substrate backside. In an embodiment, as a first operation, a wafer dice side (IC side) is attached onto a protection layer or stack or tape (e.g., such as those often used during backside grinding). Next, a DPSS nanosecond, or picosecond, or femtosecond pulsed laser is used to scribe the backside metallization. The wafer is then transferred and mounted on its backside on dicing tape. The protection tape is removed from the wafer front side. Following this, a front side laser scribing and plasma etching process is performed to complete dicing.

One or more advantages of embodiments described herein include, but need not be limited to: it is an established process that each semiconductor chip has to be laser marked for registration and identification purposes prior to be packaged. Currently over 95% wafers are laser marked (on each die) from back side before wafers are diced. The remaining 5% wafers have to be laser marked post dicing for the special cases such as when dicing before grinding (DBG) approach is adopted, but in the latter case most often there is no backside metallization on the wafer needed. In the former case where die-to-die laser marking is performed before dicing, the wafer front side is mounted on a tape frame, and laser marking is made on each die from back side. To ensure marking located precisely on each die, the wafer has to be pre-aligned and mapped. After marking, the front side tape is removed and wafer backside is mounted on a dicing tape for dicing. Lasers used for marking are low cost nanosecond pulsed infrared (~1 um wavelength) or second harmonic (500-540 nm) laser sources. These laser sources couple very well with backside metallization.

As such, one or more embodiments involve using a same laser for a marking process to scribe and remove the backside metallization in the same setup, which conforms to the existing process flow. The additional investment to implement backside metallization scribing process is minimum. For ultrathin wafers such as below 50 um, to avoid excessive thermal damage to dies from laser backside marking and backside metallization scribing, short pulsed lasers such as single digit nanosecond lasers, picosecond lasers or femtosecond lasers may be needed. Wavelength-wise, second harmonic (e.g., 500-540 nm) laser sources will be preferred to significantly reduce laser absorption depth from approximately 1 um at 1.0 um infrared to approximately 0.1 um at second harmonic.

Accordingly, as described in greater detail below, one or more embodiments involve dicing from both a wafer backside and front side. As an example, FIG. 1 is a flowchart 100 including operations for a backside laser scribe plus front side laser scribe and plasma etch dicing process, in accordance with an embodiment of the present invention. FIGS. 2A-2E illustrate cross-sectional views representing various operations in a backside laser scribe plus front side laser scribe and plasma etch dicing process, corresponding to the operations of flowchart 100.

Figure 2A:
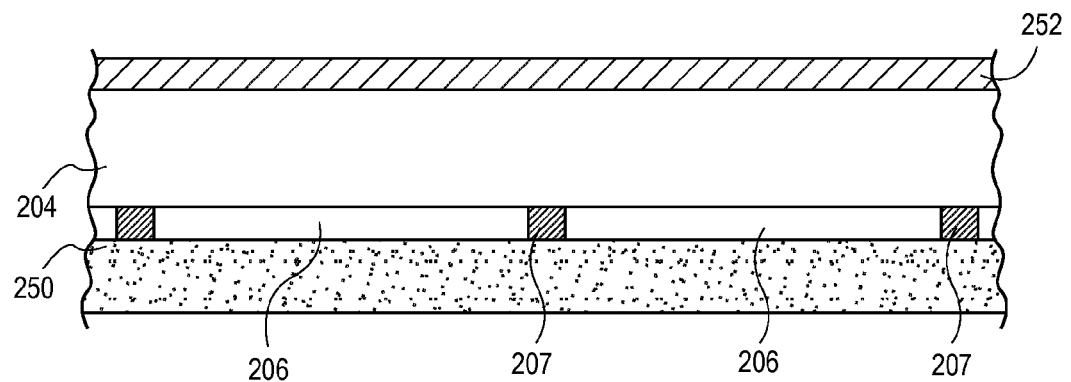
FIGS. 2A-2E illustrate cross-sectional views representing various operations in a backside laser scribe plus front side laser scribe and plasma etch dicing process, in accordance with an embodiment of the present invention.

Referring to operations 102 and 104 of Flowchart 100, and corresponding FIG. 2A, post wafer test a protection layer or tape 250 is attached to a wafer 204 front side, i.e., on the side of the wafer 204 having integrated circuits 206 thereon. The integrated circuits 206 are separated by streets 207, which may include metallization and dielectric layers similar to those of the integrated circuits 206. For example, streets 207 may be composed of layers of dielectric materials, semiconductor materials, and metallization. In one embodiment, one or more of the streets 207 includes test devices similar to the actual devices of the integrated circuits 206. It is to be appreciated that the integrated circuits 206 (and the streets 207) need not be planar as shown. Instead, topography may be present due to the inclusion of bumps/pillars and other like features. Backside metallization 252 layers (and corresponding dielectric layers) are included on the backside of the wafer or substrate 204.

Figure 2B:
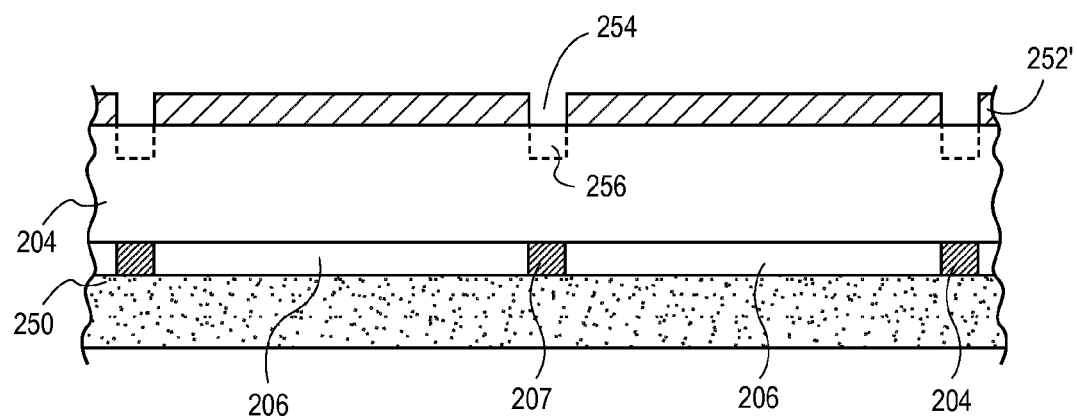

Referring to operation 106 of Flowchart 100, and corresponding FIG. 2B, the backside metallization 252 is scribed with a first laser scribing process to provide patterned backside metallization 252' with laser scribe lines 254 therein. The laser scribe lines 254 may terminate at the surface of wafer 204 or may extend as trenches 256 into wafer 204. A laser marking of the backside of the wafer 204 may also be performed at this time.

Figure 2C:
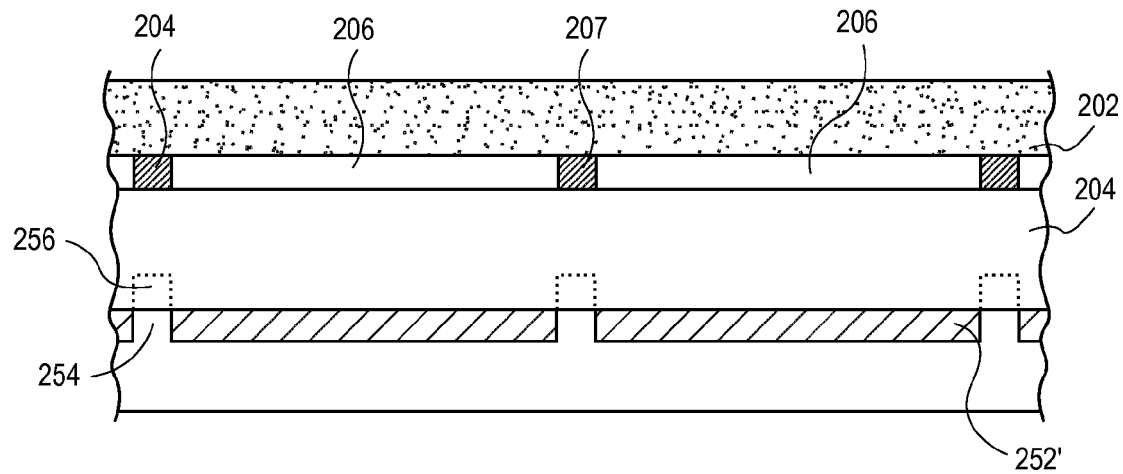

Referring to operations 108 and 110 of Flowchart 100, and corresponding FIG. 2C, a dicing tape is attached to the wafer backside (e.g., on the patterned metallization 252'). A mask layer 202 is formed on the wafer 204 front side, i.e., on or above the integrated circuits 206 and streets 207. The mask layer 204 may be formed in a coating and baking operation.

Figure 2D:
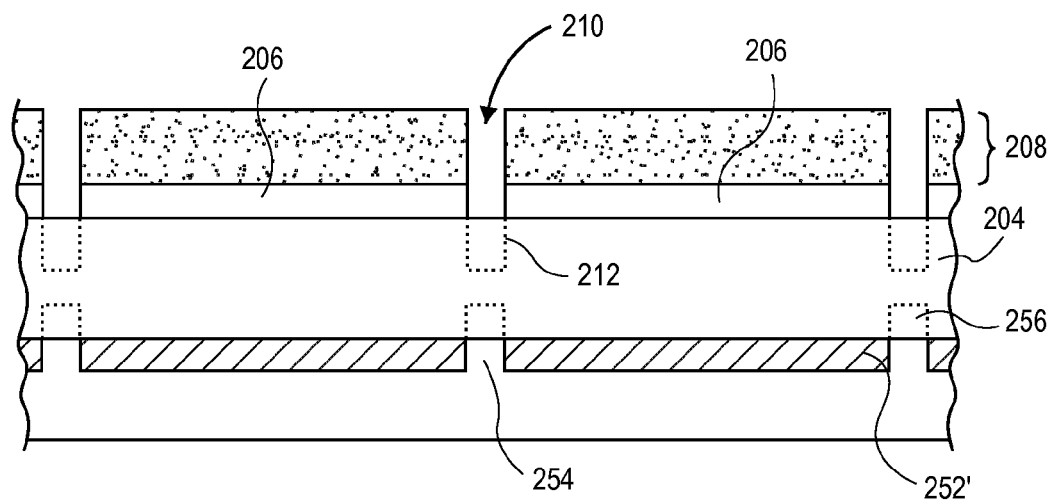

Referring to operation 112 of Flowchart 100, and corresponding FIG. 2D, the mask 202 and streets 207 are scribed with a second laser scribing process to provide patterned mask 208 with laser scribe lines 210 therein, and to remove the material from streets 207. The laser scribe lines 210 may terminate at the surface of wafer 204 or may extend as trenches 212 into wafer 204. In accordance with an embodiment of the present invention, the scribe lines 210 are aligned with the scribe lines 254 formed during the first laser scribing operation.

Figure 2E:
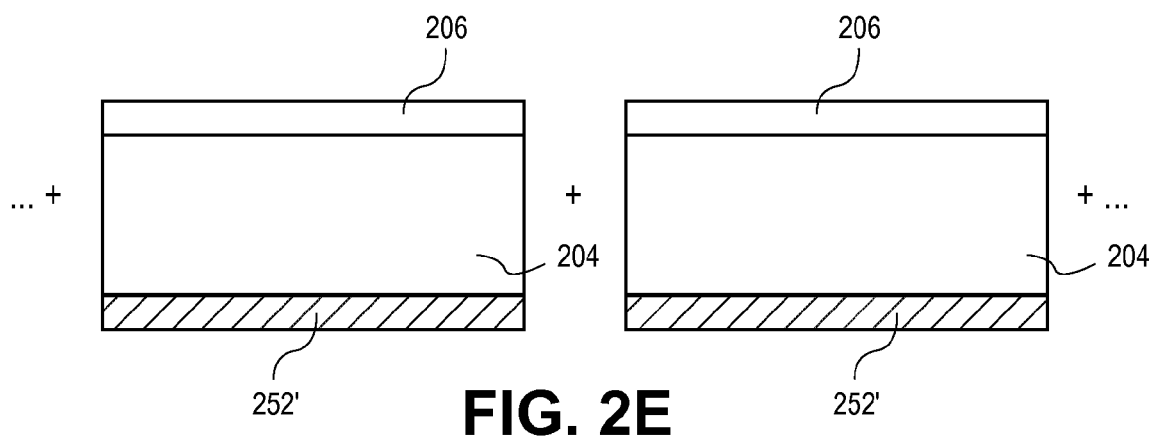

Referring to operations 114 and 116 of Flowchart 100, and corresponding FIG. 2E, a plasma etch process is used to singulate wafer 204 into individual ICs (i.e., as individual ICs 206). In an embodiment, the plasma etch is performed through scribe lines 210, using patterned mask 208 to protect the ICs 206 during the plasma etching. In one such embodiment, the plasma etch process is used to connect scribe lines 210 and 254, effectively singulating the IC's without interference from street or backside metallization material. In an embodiment, post-dicing wafer operations may be performed, such as mask material removal and removal of backside tape layers, etc.

Thus, in accordance with an embodiment of the present invention, a combination of backside laser scribing and front side laser scribing and plasma etching is used to dice a semiconductor wafer into individualized or singulated integrated circuits. In one embodiment, both laser scribing operations are used as essentially, if not totally, non-thermal processes. For example, the backside and front side laser scribing may be localized with no or negligible heat damage zone. In an embodiment, approaches herein are used to singulated integrated circuits having ultra-low k films, and wafers having metallization on both the front and back surfaces. With convention dicing, saws may need to be slowed down to accommodate such low k films.

In an embodiment, the semiconductor wafer or substrate that is scribed is composed of a material suitable to withstand a fabrication process and upon which semiconductor processing layers may suitably be disposed. For example, in one embodiment, the semiconductor wafer or substrate is composed of a group IV-based material such as, but not limited to, crystalline silicon, germanium or silicon/germanium. In a specific embodiment, providing the semiconductor wafer includes providing a monocrystalline silicon substrate. In a particular embodiment, the monocrystalline silicon substrate is doped with impurity atoms. In another embodiment, the semiconductor wafer or substrate is composed of a III-V material such as, e.g., a III-V material substrate used in the fabrication of light emitting diodes (LEDs).

In an embodiment, the semiconductor wafer or substrate has disposed on its front side an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. One or more of the dielectric layers can be a low-k dielectric layer. In one embodiment, the semiconductor wafer or substrate has disposed metallization layers (and corresponding dielectric layers) on the backside of the wafer or substrate. More generally, many functional layers of different material types (e.g., conductors, insulators, semiconductors) and thicknesses can be disposed on both the backside and the front side of the substrate. Such materials may include, but are not limited to, organic materials such as polymers, metals, or inorganic dielectrics such as silicon dioxide and silicon nitride. A low K dielectric layer may also be included (e.g., a layer having a dielectric constant of less than the dielectric constant of 4.0 for silicon dioxide). In a specific embodiment, the low K dielectric layers are composed of a carbon-doped silicon oxide material.

In the case that mask layer 202 is a water-soluble mask layer, in an embodiment, the water-soluble layer is readily dissolvable in an aqueous media. For example, in one embodiment, the water-soluble layer is composed of a material that is soluble in one or more of an alkaline solution, an acidic solution, or in deionized water. In an embodiment, the water-soluble layer maintains its water solubility upon a heating process, such as heating approximately in the range of 50-160 degrees Celsius. For example, in one embodiment, the water-soluble layer is soluble in aqueous solutions following exposure to chamber conditions used in a laser and plasma etch singulation process. In one embodiment, the water-soluble die layer is composed of a material such as, but not limited to, polyvinyl alcohol, polyacrylic acid, dextran, polymethacrylic acid, polyethylene imine, or polyethylene oxide. In a specific embodiment, the water-soluble layer has an etch rate in an aqueous solution approximately in the range of 1-15 microns per minute and, more particularly, approximately 1.3 microns per minute. In another specific embodiment, the water-soluble layer is formed by a spin-on technique.

In the case that mask layer 202 is a UV-curable mask layer, in an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, one or both of the front side or backside laser scribing processes involves using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as low-k dielectric layers and backside metallization layers.

Figure 3:
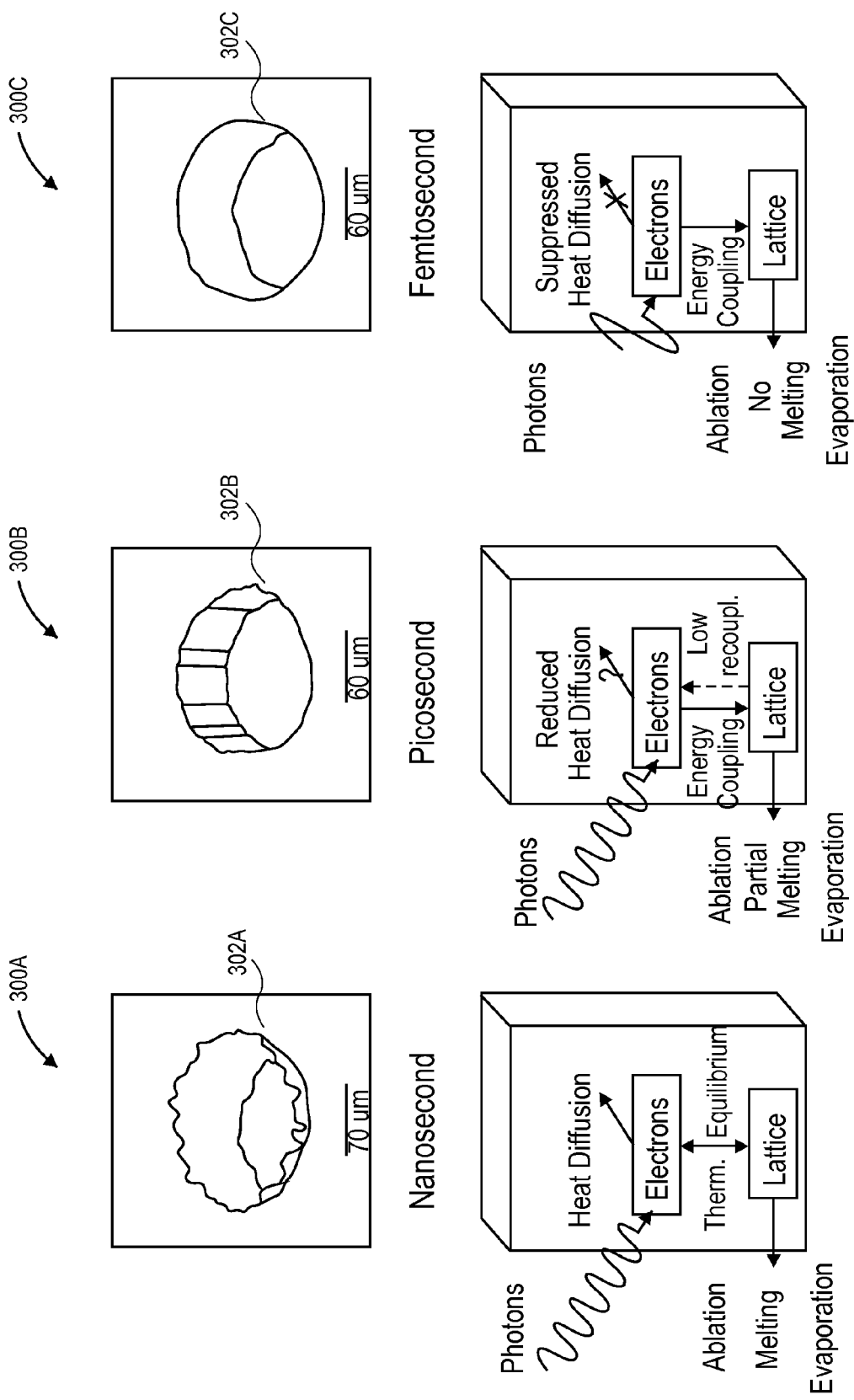
FIG. 3 illustrates the effects of using a laser pulse in the femtosecond range versus longer pulse times, in accordance with an embodiment of the present invention.

FIG. 3 illustrates the effects of using a laser pulse in the femtosecond range versus longer frequencies, in accordance with an embodiment of the present invention. Referring to FIG. 3, by using a laser with a pulse width in the femtosecond range heat damage issues are mitigated or eliminated (e.g., minimal to no damage 302C with femtosecond processing of a via 300C) versus longer pulse widths (e.g., damage 302B with picosecond processing of a via 300B and significant damage 302A with nanosecond processing of a via 300A). The elimination or mitigation of damage during formation of via 300C may be due to a lack of low energy recoupling (as is seen for picosecond-based laser ablation) or thermal equilibrium (as is seen for nanosecond-based laser ablation), as depicted in FIG. 3. However, as mentioned above, nanosecond, picosecond- or femtosecond-based laser scribing may be considered for embodiments herein.

As mentioned above, in an embodiment, etching the semiconductor wafer or substrate includes using a plasma etching process. In one embodiment, an ultra-high-density plasma source is used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of treating and/or etching silicon may be used. In a specific embodiment, the etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In another embodiment, a plurality of integrated circuits may be separated by streets having a width of approximately 10 microns or smaller. The use of a backside laser scribing and front side laser scribing and plasma etching dicing approach, at least in part due to the tight profile control of the laser, may enable such compaction in a layout of integrated circuits. For example, FIG. 4 illustrates compaction on a semiconductor wafer or substrate achieved by using narrower streets versus conventional dicing which may be limited to a minimum width, in accordance with an embodiment of the present invention.

Figure 4:
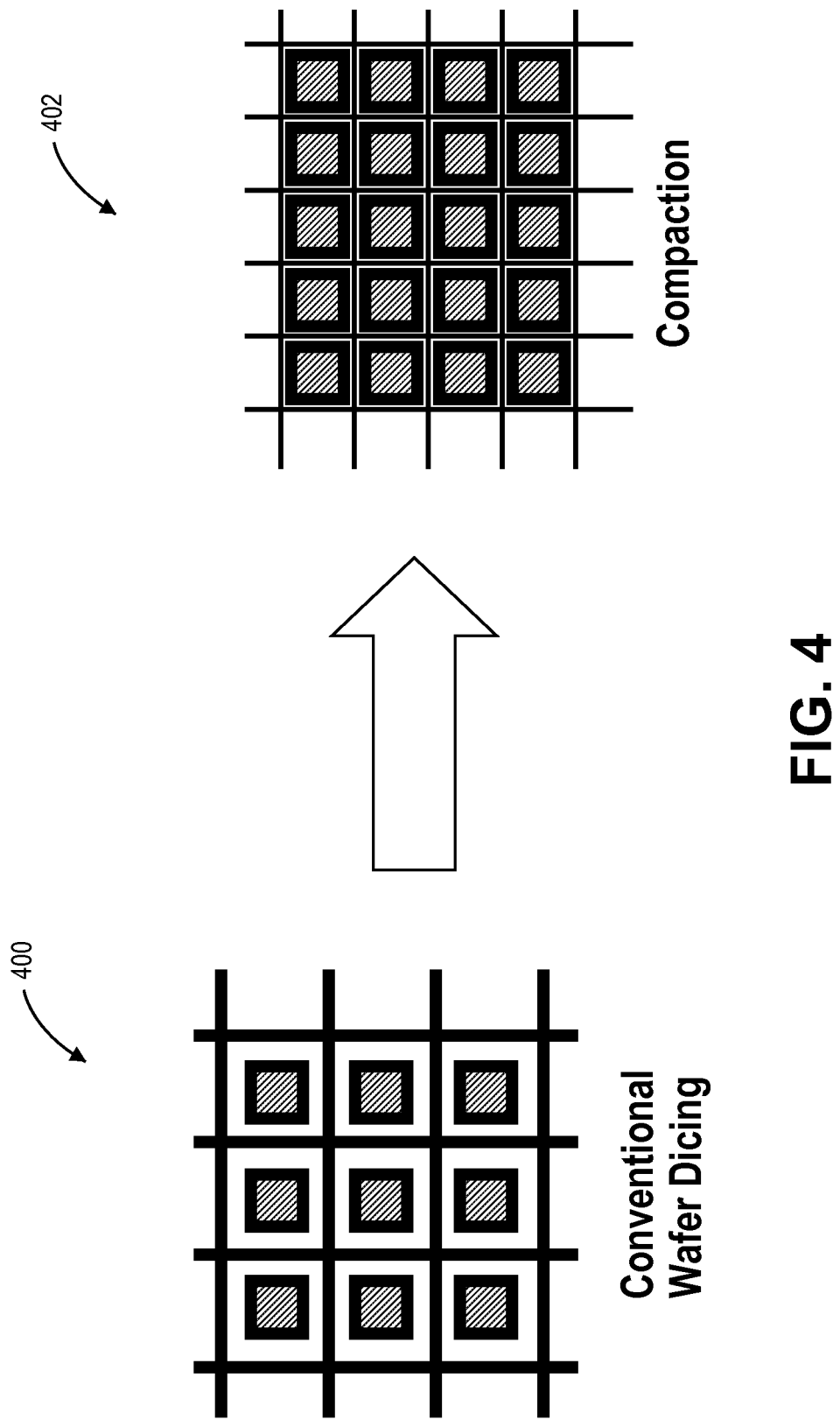
FIG. 4 illustrates compaction on a semiconductor wafer achieved by using narrower streets versus conventional dicing which may be limited to a minimum width, in accordance with an embodiment of the present invention.

Referring to FIG. 4, compaction on a semiconductor wafer is achieved by using narrower streets (e.g., widths of approximately 10 microns or smaller in layout 402) versus conventional dicing which may be limited to a minimum width (e.g., widths of approximately 70 microns or larger in layout 400). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 5:
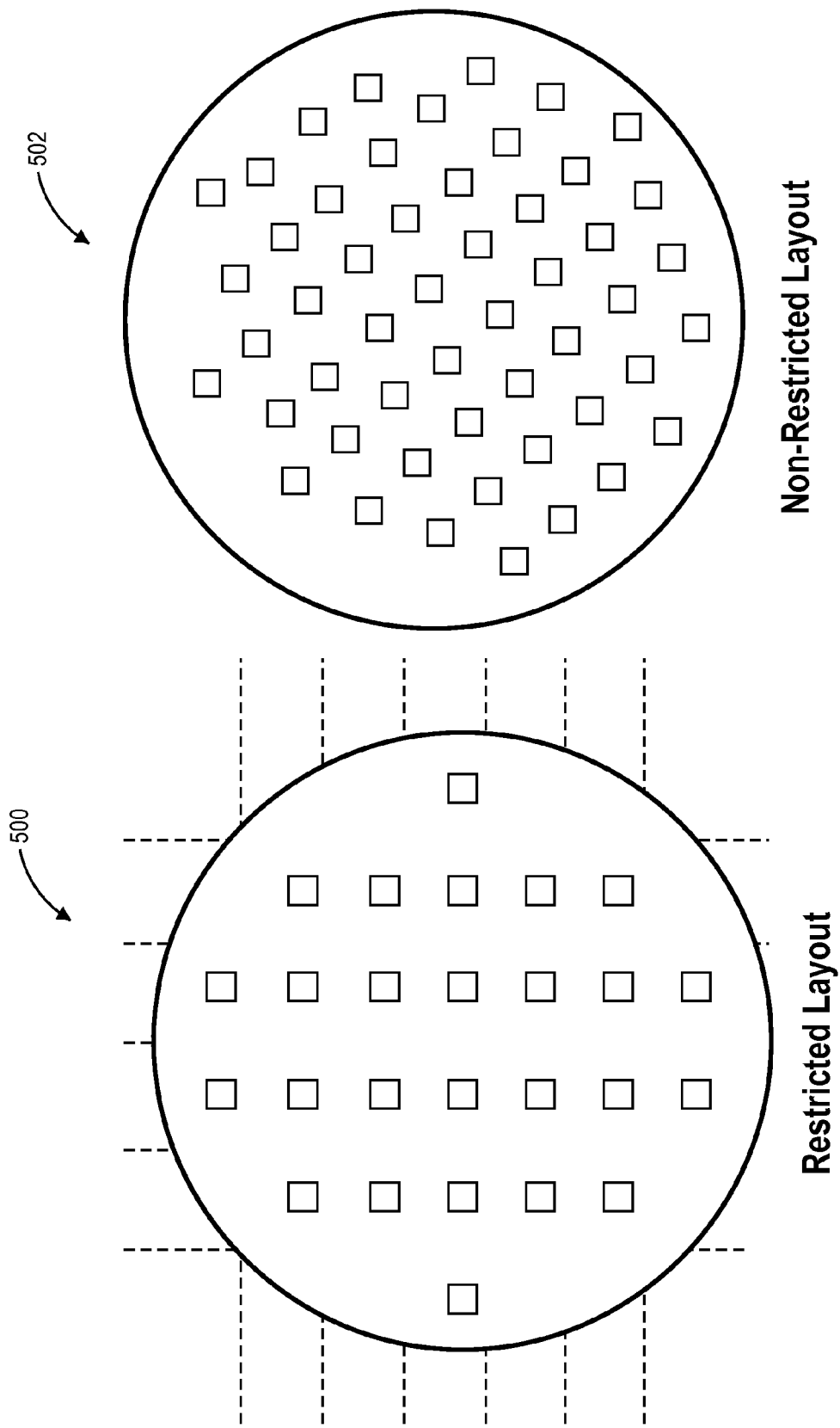
FIG. 5 illustrates freeform integrated circuit arrangement allowing denser packing and, hence, more die per wafer versus grid alignment approaches, in accordance with an embodiment of the present invention.

In another embodiment, a plurality of integrated circuits may be arranged on a semiconductor wafer or substrate in a non-restricted layout. For example, FIG. 5 illustrates freeform integrated circuit arrangement allowing denser packing. The denser packing may provide for more die per wafer versus grid alignment approaches, in accordance with an embodiment of the present invention. Referring to FIG. 5, a freeform layout (e.g., a non-restricted layout on semiconductor wafer or substrate 502) allows denser packing and hence more die per wafer versus grid alignment approaches (e.g., a restricted layout on semiconductor wafer or substrate 500). In an embodiment, the speed of the laser ablation and plasma etch singulation process is independent of die size, layout or the number of streets.

A single process tool may be configured to perform many or all of the operations in a backside laser scribing and front side laser scribing and plasma etch singulation process. For example, FIG. 6 illustrates a block diagram of a tool layout for laser and plasma dicing of wafers or substrates, in accordance with an embodiment of the present invention.

Figure 6:
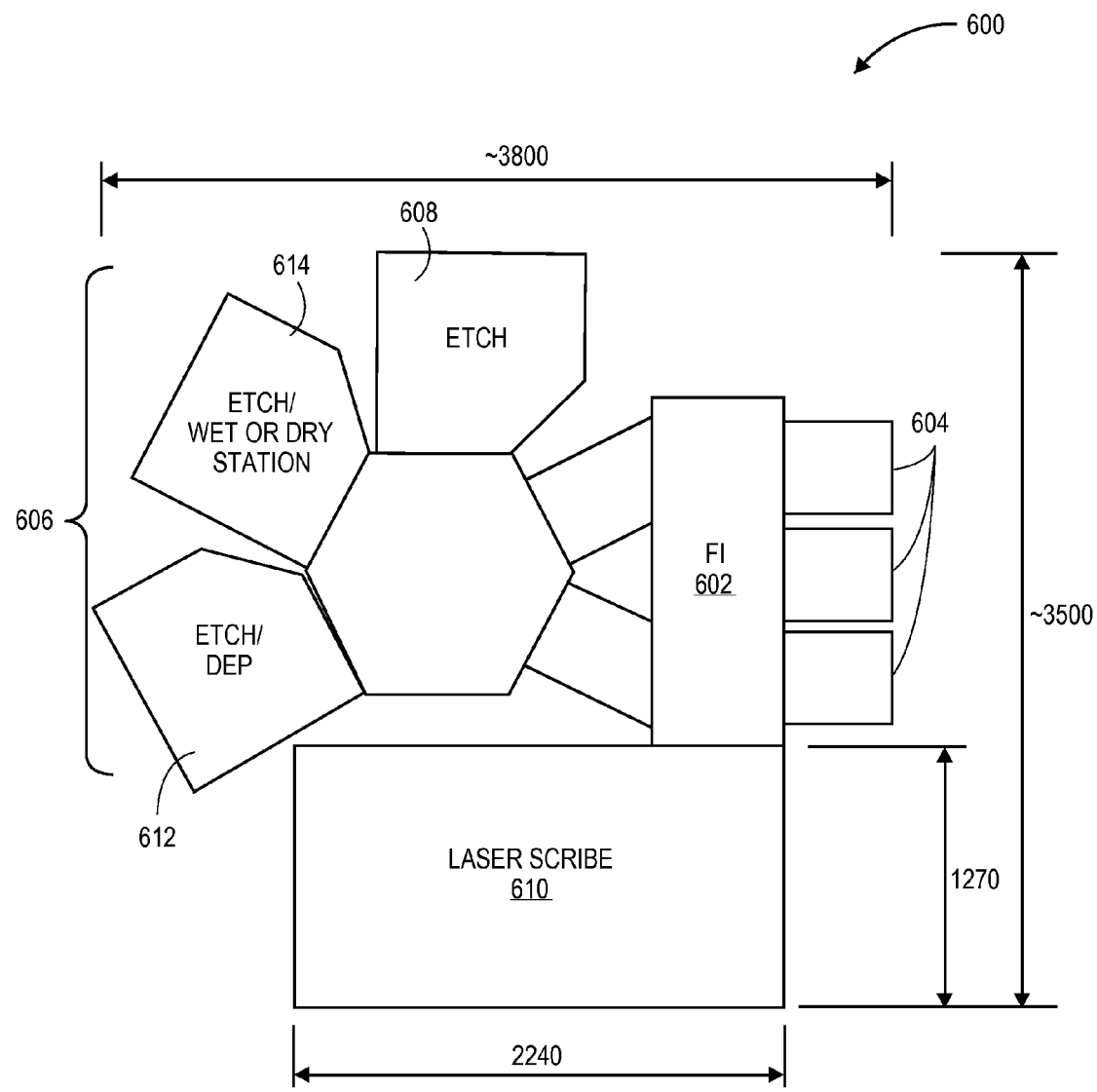
FIG. 6 illustrates a block diagram of a tool layout for laser scribing and plasma dicing of wafers or substrates, in accordance with an embodiment of the present invention.

Referring to FIG. 6, a process tool 600 includes a factory interface 602 (FI) having a plurality of load locks 604 coupled therewith. A cluster tool 606 is coupled with the factory interface 602. The cluster tool 606 includes one or more plasma etch chambers, such as plasma etch chamber 608. A laser scribe apparatus 610 is also coupled to the factory interface 602. The overall footprint of the process tool 600 may be, in one embodiment, approximately 3500 millimeters (3.5 meters) by approximately 3800 millimeters (3.8 meters), as depicted in FIG. 6.

In an embodiment, the laser scribe apparatus 610 houses a nanosecond, picosecond- or femtosecond-based laser, and preferably a femto-second based laser. The nanosecond, picosecond- or femtosecond-based laser is suitable for performing a backside and/or front side laser ablation portion of a laser and etch singulation process, such as the laser abalation processes described above. In one embodiment, a moveable stage is also included in laser scribe apparatus 600, the moveable stage configured for moving a wafer or substrate (or a carrier thereof) relative to the picosecond- or femtosecond-based laser. In a specific embodiment, the nanosecond-, picosecond- or femtosecond-based laser is also moveable. The overall footprint of the laser scribe apparatus 610 may be, in one embodiment, approximately 2240 millimeters by approximately 1270 millimeters, as depicted in FIG. 6.

In an embodiment, the one or more plasma etch chambers 608 is an Applied Centura® Silvia™ Etch system, available from Applied Materials of Sunnyvale, Calif., USA. The etch chamber may be specifically designed for a silicon etch or treatment used in a process to create singulate integrated circuits housed on or in single crystalline silicon substrates or wafers. In an embodiment, a high-density plasma source is included in the plasma etch chamber 608 to facilitate high silicon etch rates. In an embodiment, more than one etch chamber is included in the cluster tool 606 portion of process tool 600 to enable high manufacturing throughput of the singulation or dicing process.

The factory interface 602 may be a suitable atmospheric port to interface between an outside manufacturing facility with laser scribe apparatus 610 and cluster tool 606. The factory interface 602 may include robots with arms or blades for transferring wafers (or carriers thereof) from storage units (such as front opening unified pods) into either cluster tool 606 or laser scribe apparatus 610, or both.

Cluster tool 606 may include other chambers suitable for performing functions in a method of singulation. For example, in one embodiment, in place of an additional etch chamber, a deposition chamber 612 is included. The deposition chamber 612 may be configured for mask deposition on or above a backside and/or front side of a wafer or substrate prior to laser scribing of the wafer or substrate. In one such embodiment, the deposition chamber 612 is suitable for depositing a water soluble mask layer. In another embodiment, in place of an additional etch chamber, a wet/dry station 614 is included. The wet/dry station may be suitable for cleaning residues and fragments, or for removing a water soluble mask, subsequent to a laser scribe and plasma etch singulation process of a substrate or wafer. In another embodiment, the deposition chamber 612 is suitable for depositing a UV-curable mask layer, and a UV source is included with the tool. In an embodiment, a metrology station is also included as a component of process tool 600.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
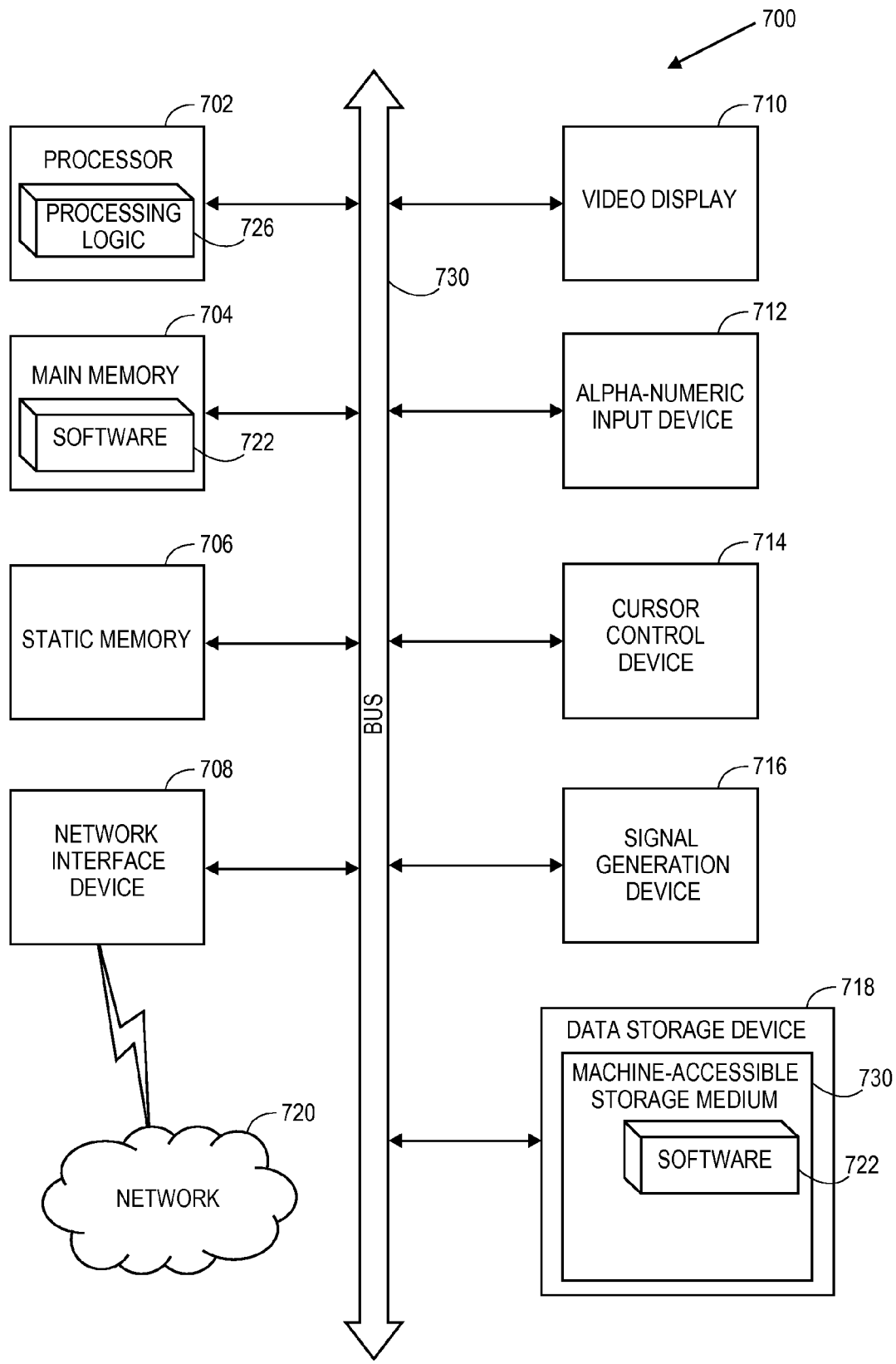
FIG. 7 illustrates a block diagram of an exemplary computer system, in accordance with an embodiment of the present invention.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media. In accordance with an embodiment of the present invention, a machine-accessible storage medium has instructions stored thereon which cause a data processing system to perform an above described method of dicing a semiconductor wafer having a plurality of integrated circuits.

Thus, approaches for backside laser scribe plus front side laser scribe and plasma etch dicing of a wafer or substrate have been disclosed.

What is claimed is:

1. A method of dicing a semiconductor wafer comprising a plurality of integrated circuits on a front side thereof and metallization on a backside thereof, the method comprising:
   patterning the metallization on the backside with a first laser scribing process to provide a first plurality of laser scribe lines on the backside, and die marking the back side of the semiconductor wafer during the first laser scribing process, the patterning performed without using a mask;
   subsequent to performing the first laser scribing process, forming a mask on the front side of the semiconductor wafer;

patterning, from the front side of the semiconductor wafer, the mask with a second laser scribing process to provide a patterned mask and to provide a second plurality of scribe lines exposing regions of the semiconductor wafer between the integrated circuits, wherein the second plurality of scribe lines is aligned with the first plurality of scribe lines; and plasma etching the semiconductor wafer through the second plurality of scribe lines to singulate the integrated circuits.

2. The method of claim 1, wherein the first and second laser scribing processes involve using the same laser conditions.

3. The method of claim 1, wherein the first and second laser scribing processes involve using a femtosecond-based laser.

4. The method of claim 1, wherein the first plurality of scribe lines comprises trenches formed partially into the backside of the semiconductor wafer.

5. The method of claim 1, wherein the second plurality of scribe lines comprises trenches formed partially into the front side of the semiconductor wafer.

6. The method of claim 1, wherein forming the mask on the front side comprises forming a water soluble mask.

7. The method of claim 1, wherein forming the mask on the front side comprises forming a UV-curable mask.

8. The method of claim 1, wherein the first and second laser scribing processes involve using different laser conditions.

9. A method of dicing a semiconductor wafer comprising a plurality of integrated circuits on a front side thereof and metallization on a backside thereof, the method comprising:

patterning the metallization on the backside with a first laser scribing process to provide a first plurality of laser scribe lines on the backside, the patterning performed without using a mask;

subsequent to performing the first laser scribing process, forming a mask on the front side of the semiconductor wafer;

patterning, from the front side of the semiconductor wafer, the mask with a second laser scribing process to provide a patterned mask and to provide a second plurality of scribe lines exposing regions of the semiconductor wafer between the integrated circuits, wherein the second plurality of scribe lines is aligned with the first plurality of scribe lines; and plasma etching the semiconductor wafer through the second plurality of scribe lines to singulate the integrated circuits.

10. The method of claim 9, wherein the first and second laser scribing processes involve using the same laser conditions.

11. The method of claim 9, wherein the first and second laser scribing processes involve using a femtosecond-based laser.

12. The method of claim 9, wherein the first plurality of scribe lines comprises trenches formed partially into the backside of the semiconductor wafer.

13. The method of claim 9, wherein the second plurality of scribe lines comprises trenches formed partially into the front side of the semiconductor wafer.

14. The method of claim 9, wherein forming the mask on the front side comprises forming a water soluble mask.

15. The method of claim 9, wherein forming the mask on the front side comprises forming a UV-curable mask.

16. The method of claim 9, wherein the first and second laser scribing processes involve using different laser conditions.

* * * * *